United States Patent [19]

Bosnyak et al.

[11] Patent Number: 4,670,708

[45] Date of Patent: * Jun. 2, 1987

[54] SHORT DETECTOR FOR FUSIBLE LINK ARRAY USING A PAIR OF PARALLEL CONNECTED REFERENCE FUSIBLE LINKS

[75] Inventors: Bob Bosnyak, Palo Alto; Albert Chan, San Jose; Mark Fitzpatrick, San Jose; Gary Gouldsberry, San Jose; Cyrus Tsui, San Jose; Andrew K. Chan, Milpitas, all of Calif.

[73] Assignee: Monolithic Memories, Inc., Santa Clara, Calif.

[*] Notice: The portion of the term of this patent subsequent to Jan. 20, 2004 has been disclaimed.

[21] Appl. No.: 635,861

[22] Filed: Jul. 30, 1984

[51] Int. Cl.[4] ............................................. G01R 31/02
[52] U.S. Cl. ................................ 324/51; 324/73 PC; 371/21; 371/25
[58] Field of Search .......... 324/73 R, 73 PC, 73 AT, 324/51, 52, 158 T; 371/21, 25, 15; 365/201, 96

[56] References Cited

U.S. PATENT DOCUMENTS 4,499,579  2/1985  Still et al. ................................ 371/15

OTHER PUBLICATIONS

Logue et al., Programmable Logic Array Error Detection and Error Correction, Jul. 1976, IBM Technical Disclosure Bulletin, vol. 19, No. 2, pp. 588-590.

Primary Examiner—Reinhard J. Eisenzopf
Assistant Examiner—Jack B. Harvey
Attorney, Agent, or Firm—Walter J. Madden; Steven F. Caserza; Alan H. MacPherson

[57] ABSTRACT

Circuitry is provided for testing fusible link arrays for short circuits around the fusible links. Each link is electrically isolated and compared with a pair of reference fusible links to detect the presence or absence of a short circuit.

5 Claims, 3 Drawing Figures

SHORT DETECTOR FOR FUSIBLE LINK ARRAY USING A PAIR OF PARALLEL CONNECTED REFERENCE FUSIBLE LINKS

BACKGROUND OF THE INVENTION

1. Field of the Invention

This invention relates to the testing for short circuits in fusible link arrays which are used in Programmable Read Only Memories (PROM) and Programmable Array Logic, and the like.

2. Description of the Prior Art

In a typical array employing fusible links, a bit of information is represented by a fusible link, also called a "fuse". The presence or absence of a fuse determines the logical state of a bit. The device is manufactured with all fuses intact; that is, all bits in one logical state. The user of the device can choose the state of a bit by either leaving the fuse intact, or blowing the fuse (programming the bit) to create an open circuit (i.e. an absent fuse.) Ideally, all devices manufactured will have all their fuses intact before being packaged and sold, and when sold, every fuse the user wants to blow will, indeed, blow. In reality, of course, this is not the case. Some devices have fuses missing and some devices will have fuses that won't blow.

A missing fuse in the array is easy to detect, and is caught before the device is packaged. It is detected by checking the logical state on the output pin of the device. The logical state for a missing fuse will be opposite to that for an intact fuse. The device can be tested for any missing fuses at the wafer sorting level of the manufacturing process.

When a fuse is intact but refuses to blow, it is for one of several reasons. The fuse itself may be fatter or thicker than a normal fuse and therefore requires more power to blow; more indeed than the programmer can provide. It, therefore, remains intact when an attempt to program it is made. Also, metal can short out the fuse. For example, a small piece of metal can short from the emitter of the array transistor to the bit line. Metal can also short from the word line to the bit line. In both cases, the metal will not blow as a fuse will. The metal requires a great deal more power to melt and breakdown than the fuse material, and it prevents the fuse from blowing by providing an alternate path for the programming current. The fuse, therefore, remains intact.

These are examples of what is defined collectively as a "fuse short". Previous to the present invention there was no way to detect fuse shorts.

In summary, a missing fuse can be found by detecting the wrong logical state at the output pin of the device. However, a fuse short will show the correct logical state on the output until an attempt is made to program it, at which time the output pin will still show the logical state of an intact fuse indicating that the fuse has failed to blow. The problem is that the device has been packaged and sold to the user before the fuse short is discovered, costing the manufacturer money, time and reputation. This invention will prevent this from occurring.

SUMMARY OF THE PRESENT INVENTION

The present invention provides for testing of an array containing fusible links, prior to its packaging, to detect fuse shorts therein. Each fusible link in the array can be individually tested and the location of any fuse short can be determined. Additionally, a plurality of intentionally shorted test fuses may be provided in the array to test the operability of the testing circuitry.

DESCRIPTION OF THE PREFERRED EMBODIMENT

Figure 1:
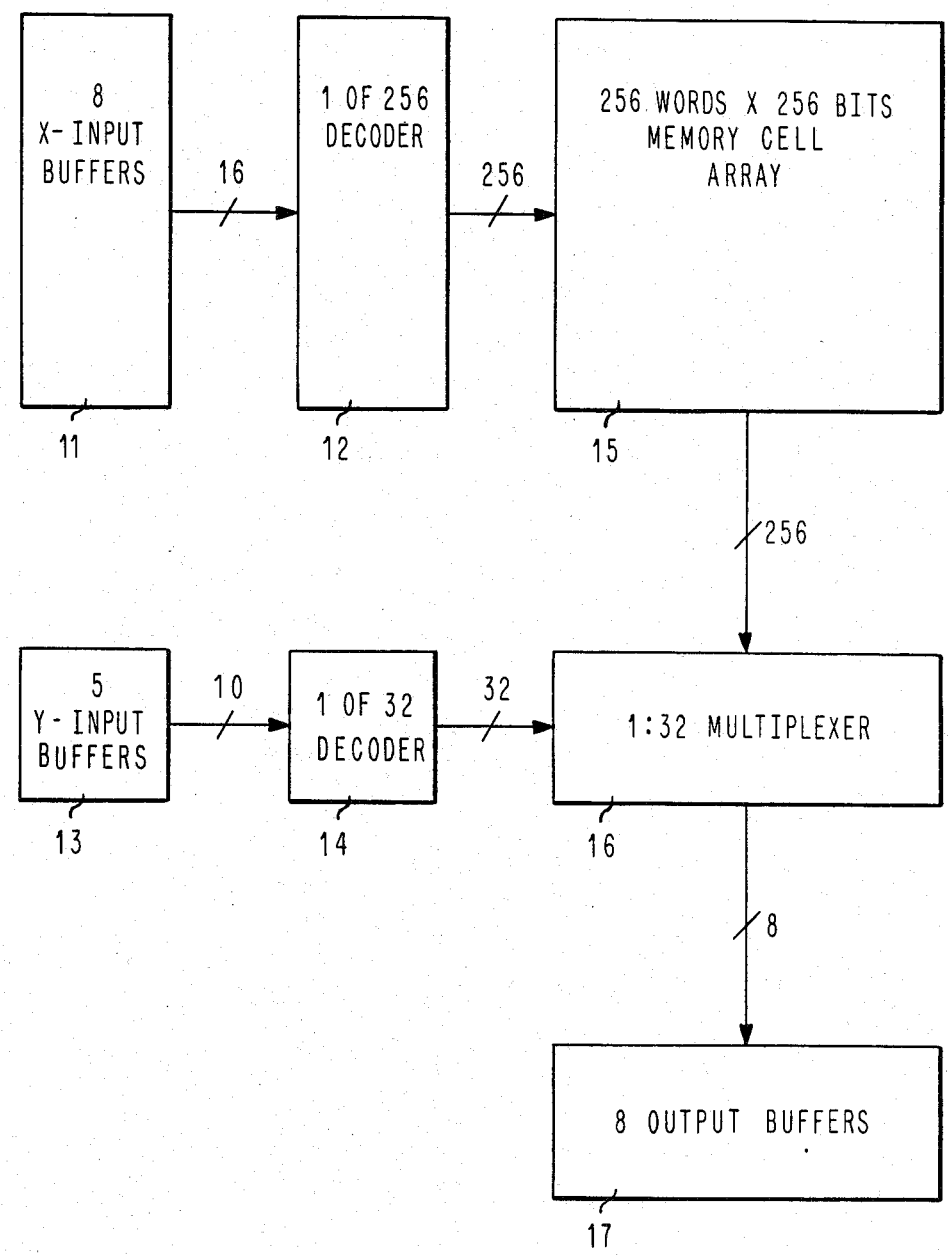
FIG. 1 is a block diagram of a typical bipolar PROM.

The organization of a 64K PROM shown in FIG. 1 is typical of most bipolar PROMs. There are 8 x-input buffers 11 which feed into a 1 of 256 decoder 12, which selects one word line in the memory cell array 15. The 5 y-input buffers 13 feed into a 1 of 32 decoder 14 which in turn feeds into a 256 line-to-8 line multiplexer 16. This chooses 8 bit lines in the array. The multiplexer 16 feeds its 8 lines to eight output buffers 17, one line to one output.

Figure 2:
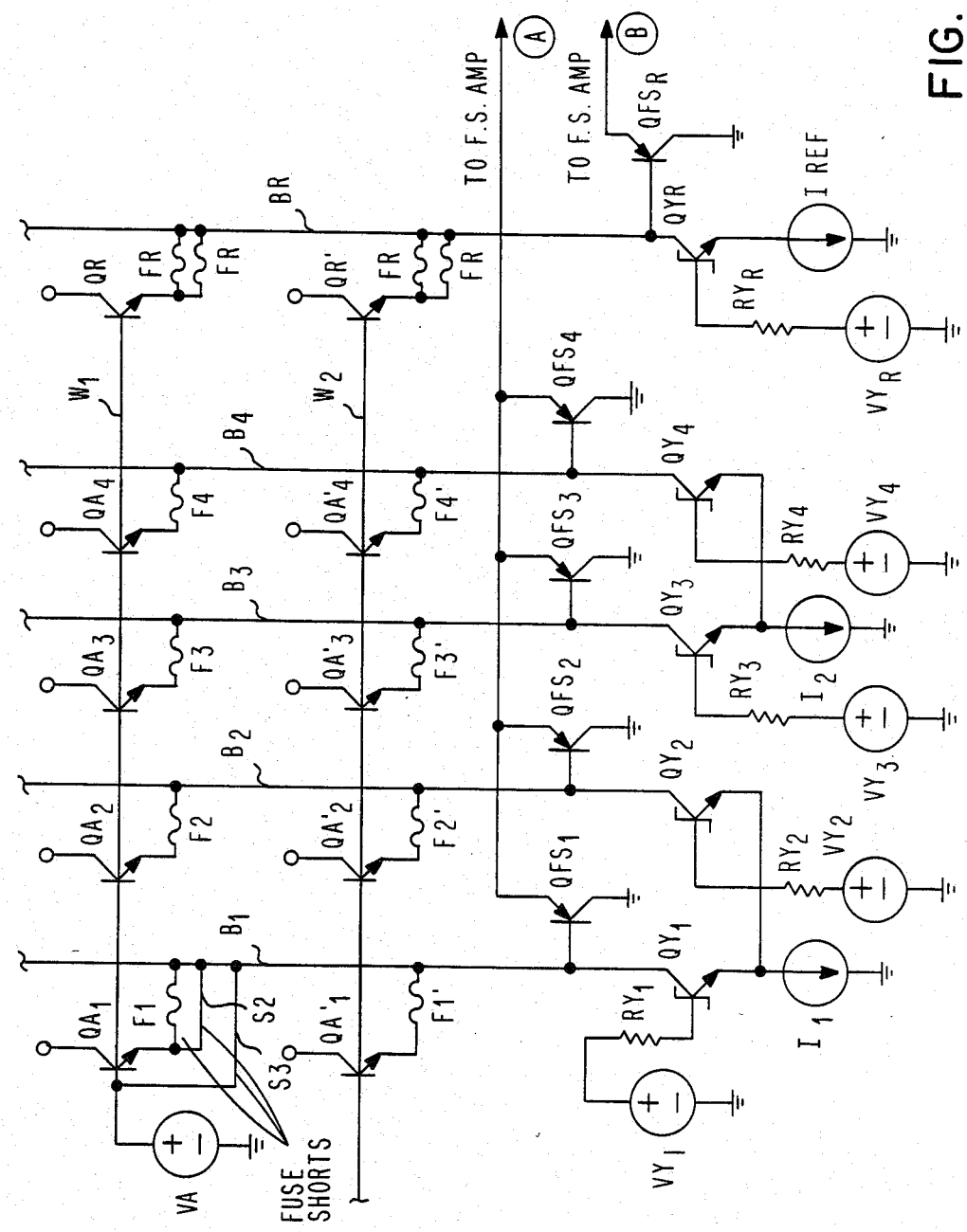
FIG. 2 is a circuit diagram showing the array and multiplexer of FIG. 1.

A very simplified view of the array and multiplexing block of FIG. 1 is given in FIG. 2. Each output accesses 32 bit lines. In FIG. 2, $B_1$ is the accessed bit line, and $B_2$ represents the 31 unselected bit lines. $QY_1$ is the multiplexer transistor which is on to select $B_1$. $QY_2$ represents the 31 multiplexer transistors which are off and thus not selecting the bit lines represented by $B_2$. The emitters of $QY_1$ and $QY_2$ are common and are connected to $I_1$, the sense amplifier current for one output. The sense amplifier detects the presence or absence of a fuse during normal operation and feeds this information to the output buffer. The bit line $B_3$ represents the seven other bit lines that are selected and fed through seven QYs (here $QY_3$) to the seven other sense amplifier outputs. $B_4$ represents the 31 other bit lines for each output which is not selected.

$W_1$ is the selected word line. $W_2$ represents the 255 word lines not selected. $QA_1$ is on and F1 represents the bit of information sensed by $I_1$ and passed on to the output. $QA_2$ represents the other 31 array transistors available to that output and are off because $QY_2$ is off. $QA_3$ represents the array transistors going to the other seven outputs. They are on and current flows through fuse F3 from $QA_3$ to $I_2$, which represents the sense amplifier currents for the other seven outputs. $QA_4$ represents all the other array transistors not selected on $W_1$. $W_2$ represent the 255 word lines not selected, therefore $QA_1'$-$QA_4'$ are off.

The circuitry associated with the fuse short detection system operates as follows. QR is an array transistor on $W_1$. QR' represents one array transistor on each of the remaining 255 word lines represented by $W_2$. The $F_R$'s are fuses associated with the array transistors. There are two parallel fuses per QR array transistor, whereas a normal array transistor has only one fuse.

$B_R$ is the bit line connected to all the QRs through their associated fuses. QYR is the multiplexer transistor on $B_R$ and $I_{REF}$ is the reference sense amplifier current. $QFS_1$-$QFS_4$ are vertical PNP transistors, one per bit line, and $QFS_R$ is an identical vertical PNP on the reference bit line $B_R$. All the devices, resistors, etc. of the fuse shorts detection circuitry are designed to be as identical as possible to the corresponding devices in the array and multiplexer. This is because any mismatch between devices will degrade the performance of the invention.

Also shown in FIG. 2 are three possible modes of a fuse short condition in connection with fuse $F_1$. In the first condition, the short is within fuse $F_1$ itself, the result of the fuse being thicker or fatter than normal so that the programmed current will not blow it. A second potential short condition can be caused by a small piece of metal, represented by line $S_2$, producing a short between the emitter of transistor $QA_1$ and bit line $B_1$. A third fuse short condition can occur if a piece of metal, represented by $S_3$, results in a short between word line $W_1$ and bit line $B_1$.

To perform the fuse shorts detection test of the present invention, only one fuse at a time is selected. Basically, seven of the eight sense amplifiers are turned off, leaving one sense amplifier on and pulling current through one fuse. At the same time the fuse shorts circuitry (FIG. 3) has 10 V applied to a test pad. This turns on the reference current source (represented by $I_{REF}$ in FIG. 2). $I_{REF}$ is designed to match as closely as possible the sense amplifier current sources on the outputs.

The present invention utilizes the very low resistance of a fuse short to detect such a short. The operation is as follows: Referring to FIG. 2, first assume word line $W_1$ is selected as well as bit line $B_1$, and that the fuse shorts circuitry has been activated. Assume further that $F_1$ is a normal fuse with normal resistance. The voltage at the base of $QFS_1$, the vertical PNP, is:

$$V_{BQFS_1} = V_{CL} - V_{BEQA_1} - I_1 R_F \quad (1)$$

where $$V_{BEQA_1}$$

is the base-to-emitter voltage of transistor $QA_1$, $V_{CL}$ is a constant "clamp" voltage holding $W_1$ at a predetermined voltage level and $R_F$ is the resistance of fuse $F_1$.

The two fuses $F_R$ on the emitter of QR are both designed to be identical to $F_1$. Furthermore, QR is designed to be identical to $QA_1$. Therefore, the voltage at the base of $QFS_R$, a vertical PNP identical to all the other $Q_{FS, transistors}$ is:

$$V_{BQFS_R} = V_{CL} - V_{BEQR} - I_{REF}(\tfrac{1}{2} R_F) \quad (2)$$

where $$V_{BEQR} = V_{BEQA_1} \quad (3)$$

and $$I_{REF} = I_1$$

therefore:

$$V_{BQFS_R} = V_{CL} - V_{BEQA_1} - \tfrac{1}{2}(I_1 R_F)$$

Subtracting (1) from (3) we get:

$$V_{BQFS_R} - V_{BQFS_1} = V_{CL} - V_{BEQA_1} - \tfrac{1}{2} IR_F \quad (4)$$

$$[V_{CL} - V_{BEQA_1} - I_1 R_F] = \tfrac{1}{2} I_1 R_F.$$

From the above equations, it can be seen that the voltage on the base of $QFS_1$ is lower than the voltage on the base of $QFS_R$ by $\tfrac{1}{2}(I_1 R_F)$. This difference in voltage is fed to the output amplifier shown in FIG. 3, as will be described below.

Now assume that the fuse $F_1$ is shorted in one of the ways described above. The resistance across the fuse, therefore, is much lower. This shorted resistance can be identified as $R_{FS}$. The voltage at the base of $QFS_1$ is now:

$$V_{BQFS_1} = V_{CL} - V_{BEQA_1} - I_1 R_{FS} \quad (5)$$

The voltage of the base of $QFS_R$ is still:

$$V_{BQFS_R} = V_{CL} - V_{BEQA_1} - \tfrac{1}{2}(I_1 R_F) \quad (3)$$

Subtracting (3) from (5) we get:

$$V_{BQFS_1} - V_{BQFS_R} = V_{CL} - V_{BEQA_1} - I_1 R_{FS} - \quad (6)$$

$$(V_{CL} - V_{BEQA_1} - \tfrac{1}{2} I_1 R_F)$$

$$= \frac{\tfrac{1}{2} I_1 R_F - I_1 R_{FS}}{I_1 (\tfrac{1}{2} R_F - R_{FS})}$$

The smaller the value of $R_{FS}$ the larger the difference between the voltages on the bases of $QFS_1$, $QFS_R$, and the easier it is to detect the fuse short. Typically, $R_F$ is on the order of 80 ohms, and $R_{FS}$ is around 2 ohms, or about 2.5% of $R_F$. This difference is fed to the output amplifier circuitry shown in FIG. 3.

Figure 3:
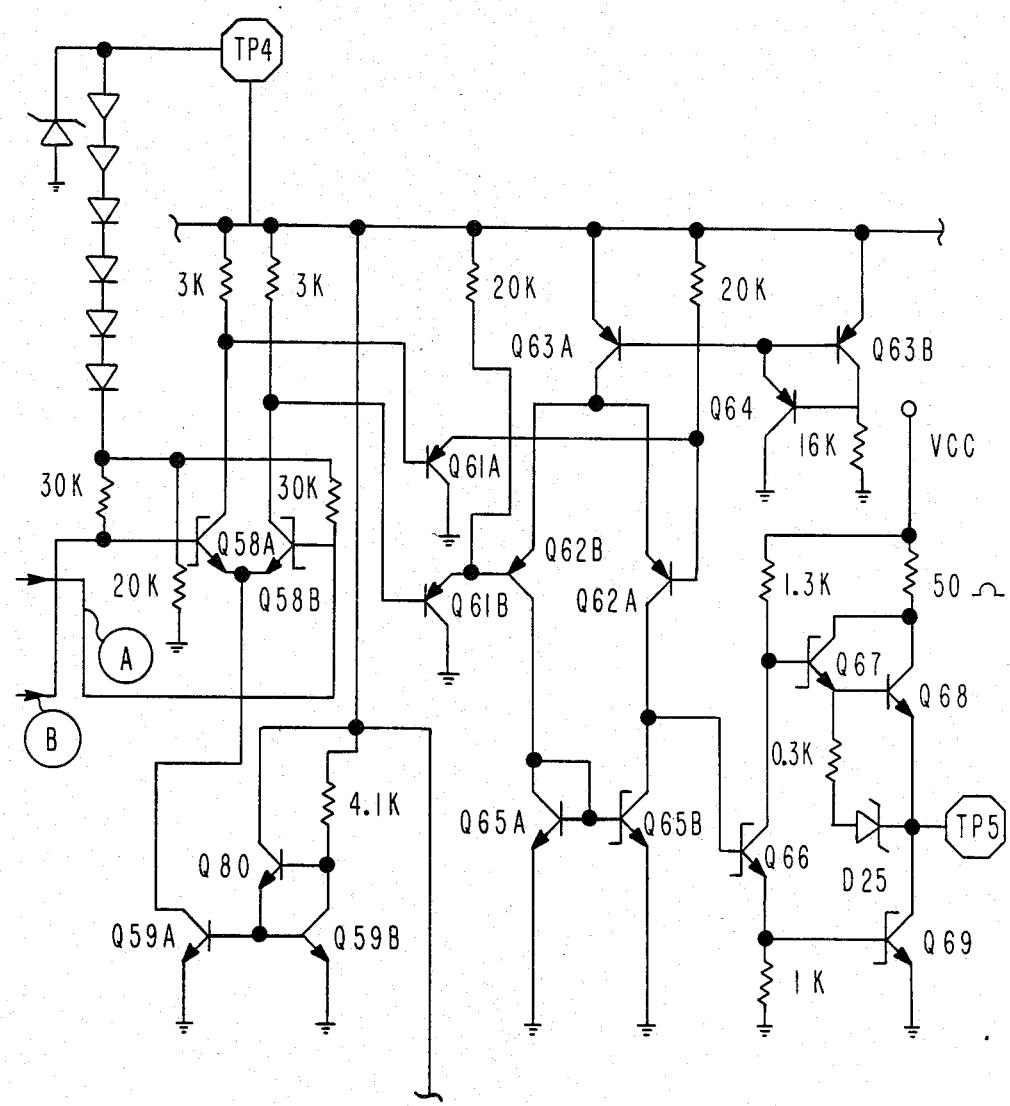
FIG. 3 is a circuit diagram showing the fuse short detection circuitry for use with the circuitry of FIG. 2.

The voltage signals from the reference bit line $B_R$ and the bit line being tested are fed to the output amplifier by way of the lines marked A and B in FIG. 2. FIG. 3 shows these same two lines A and B feeding into the bases of Q58A and Q58B. Q58A and Q58B are an emitter coupled pair with a current source tied to their emitters. The current source is comprised of Q59A and Q59B, Q60, and the 4.1K resistor which determines the current into Q59B's collector. When testing for a fuse short, the voltages at A and B differ by a slight amount, and since the emitters of Q58A and Q58B are at the same voltage, either Q58A or Q58B will have a higher $V_{BE}$ depending on whether A or B is higher. Only a slight difference between the base-emitter voltages is needed to cause one of the Q58 transistors to provide virtually all the current required by Q59. This leaves the other Q58 virtually off. This difference in collector currents in the Q58 transistor is converted into different voltage levels at the bases of the Q61 transistors by the two 3K resistors. This difference is fed to the bases of the Q62 transistors. Q62A and Q62B are another emitter coupled pair, but they are lateral PNPs instead of NPNs. The emitter current source is comprised of Q63A and Q63B, Q64 and the 16.4K resistor. For a normal fuse, Q62A is on and Q62B is off. This cuts off current to the current mirror Q65A and Q65B. The collector of Q65B (base of Q66) rises until Q66 and Q69 turn on, and a logical low appears at TP5.

For a shorted fuse, Q62B is on and Q62A is off. Base current is provided to the current mirror Q65A and Q65B, and Q62B also satifies Q65A's collector current. Q65B can't get collector current from Q62A or Q66, so its collector voltage comes down until its Schottky clamp diode turns on. Thus, Q62B also provides Q65B collector current. Since the base of Q66 is at a saturation voltage of about 0.3 v, Q66 is off, as is Q69. The collector of Q66 goes up and the Darlington pair, Q67 and Q68, turns on, presenting a logical high to TP5 to indicate a fuse short.

I claim:

1. Circuitry for testing for short circuits in a fusible link array, said array having a plurality of discrete fusible links each having a nominal resistance $R_F$, any short circuits in one of said fusible links presenting a resistance $R_{FS}$ which is substantially lower than $R_F$, said circuitry comprising:

means for electrically isolating one of said fusible links from the other of said links;

a pair of reference fusible links each having a nominal resistance $R_F$;

a reference voltage circuit, said reference fusible links being connected in parallel with each other in said reference voltage circuit;

means for applying a voltage across the one of said fusible links under test and across said pair of reference fusible links; and means for comparing the voltage across said fusible link under test with the voltage across said pair of parallel-connected reference fusible links to provide an indication of the presence or absence of a short circuit across said fusible link under test.

2. Circuitry for testing for short circuits in a fusible link array, said array having a plurality of discrete fusible links each having a nominal resistance $R_F$, any short circuit in one of said fusible links presenting a resistance $R_{FS}$ which is substantially lower than $R_F$, said circuitry comprising:

means for electrically isolating one of said fusible links from the other of said links;

a pair of reference fusible links each having a nominal resistance $R_F$;

a reference voltage circuit, said reference fusible links being connected in parallel with each other in said reference voltage circuit;

means for applying a voltage across the one of said fusible links under test and across said pair of reference fusible links;

means for detecting whether the voltage across said fusible link under test is larger or smaller than the voltage across said pair of parallel-connected reference fusible links.

3. Circuitry in accordance with claim 2 in which said fusible links are arranged in an array having individually selectable orthogonal bit lines and word lines, the location of each of said fusible links being defined by the intersection of a bit line and a word line; and said means for electrically isolating one of said fusible links comprises means for selecting a given one of said bit lines and a given one of said word lines.

4. Circuitry in accordance with claim 3 including a pair of reference fusible links for each of said word lines.

5. Circuitry in accordance with claim 3 including a voltage source;

a first transistor connected to said voltage source through a selected one of said fusible links;

a second transistor connected to said voltage source through said pair of parallel-connected fusible links; and means for comparing the voltages across said first and second transistors to provide an indication of a short circuit across said fusible link under test.

* * * * *